US012763279B2

(12) United States Patent
Muray et al.

(10) Patent No.: US 12,763,279 B2
(45) Date of Patent: Oct. 13, 2026

(54) MINIATURE HYBRID ELECTRON BEAM COLUMN

(71) Applicant: KLA Corporation, Milpitas, CA (US)

(72) Inventors: Lawrence Muray, Moraga, CA (US); John Gerling, Livermore, CA (US); James Spallas, San Ramon, CA (US); Alan Brodie, Palo Alto, CA (US)

(73) Assignee: KLA Corporation, Milpitas, CA (US)

( * ) Notice: Subject to any disclaimer, the term of this patent is extended or adjusted under 35 U.S.C. 154(b) by 900 days.

(21) Appl. No.: 17/658,637

(22) Filed: Apr. 8, 2022

(65) Prior Publication Data

US 2023/0326704 A1 Oct. 12, 2023

(51) Int. Cl.
*H01J 37/141* (2006.01)
*H01J 37/244* (2006.01)

(52) U.S. Cl.
CPC .......... *H01J 37/141* (2013.01); *H01J 37/244* (2013.01); *H01J 2237/04922* (2013.01); *H01J 2237/1405* (2013.01)

(58) Field of Classification Search
CPC .. H01J 37/141; H01J 37/244; H01J 37/04922; H01J 37/1405; H01J 37/26
See application file for complete search history.

(56) References Cited

U.S. PATENT DOCUMENTS 4,168,434 A 9/1979 Lischke et al.
6,438,073 B1 8/2002 Shimazaki et al.
7,109,486 B1 9/2006 Spallas et al.
7,332,729 B1 * 2/2008 Muray ................. G01N 23/225 378/20
7,335,895 B1 * 2/2008 Spallas ................... H01J 37/04 250/396 R
8,003,952 B2 8/2011 Muray et al.
8,106,358 B2 1/2012 Spallas et al.
8,110,801 B2 2/2012 Indermuehle et al.
8,115,168 B2 2/2012 Muray et al.
8,698,094 B1 4/2014 Sears et al.
9,099,276 B1 8/2015 Muray et al.
10,026,588 B2 7/2018 Werder et al.
(Continued)

FOREIGN PATENT DOCUMENTS

JP H04179116 A 1/1992
JP 2007311117 A * 11/2007 ............. H01J 37/28
(Continued)

OTHER PUBLICATIONS

Bujisse B, "Minature SEM with Permanent-Magnet Lenses", Inst. Phys. Conf. Ser. No 179 Section 3, 2003, 177-180 (Year: 2003).*
Khursheed et al, "A Portable Scanning Electron Microscope Column Design Based on the Use of Permanent Magnets", Scanning vol. 20, 87-91 (1998) (Year: 1998).*
(Continued)

*Primary Examiner* — David E Smith
(74) *Attorney, Agent, or Firm* — Kwan & Olynick LLP

(57) ABSTRACT

A miniature electron beam column in combination with magnetostatic lenses to produce very high-performance miniature electron or ion beam columns. Silicon-based electron optical components provide high-accuracy formation and alignment of critical optical elements and the magnetic lenses provide low-aberration focusing or condensing elements. Accurate assembly of the silicon and magnetic components is achievable via the multilayered assembly techniques and allows for achieving high performance.

18 Claims, 5 Drawing Sheets

(56) References Cited

U.S. PATENT DOCUMENTS

| | | | | |
|---|---|---|---|---|
| 10,211,021 | B2 | 2/2019 | Plettner et al. | |
| 10,354,832 | B2 * | 7/2019 | Haynes | H01J 37/1474 |
| 10,438,769 | B1 | 10/2019 | Lipkind et al. | |
| 10,545,099 | B1 | 1/2020 | Chen et al. | |
| 10,840,056 | B2 * | 11/2020 | Haynes | H01J 37/10 |
| 10,998,158 | B1 | 5/2021 | Lewellen et al. | |
| 2005/0279937 | A1 | 12/2005 | Koike et al. | |
| 2006/0219935 | A1 | 10/2006 | Henstra | |
| 2008/0237465 | A1 | 10/2008 | Hatano et al. | |
| 2010/0065741 | A1 | 3/2010 | Gerthsen et al. | |
| 2014/0217282 | A1 | 8/2014 | Barofsky et al. | |
| 2018/0108514 | A1 * | 4/2018 | Chuang | H01J 37/073 |
| 2018/0226219 | A1 * | 8/2018 | Haynes | H01J 37/285 |
| 2019/0088446 | A1 * | 3/2019 | Xu | H01J 37/147 |
| 2019/0113470 | A1 * | 4/2019 | Mueller | H01J 37/21 |

FOREIGN PATENT DOCUMENTS

| | | | | |
|---|---|---|---|---|
| JP | 2010529587 | A | 8/2010 | |
| JP | 2013070041 | A | 4/2013 | |
| JP | 2014041948 | A | 3/2014 | |
| JP | 2014157772 | A | 8/2014 | |
| JP | 2014229481 | A | 12/2014 | |
| JP | 2021048114 | A | 3/2021 | |
| KR | 20010042510 | A | 5/2001 | |
| KR | 20200135878 | A | 12/2020 | |
| TW | 202145286 | A | 12/2021 | |
| WO | WO-2016203667 | A1 * | 12/2016 | H04N 25/70 |
| WO | 2021249872 | A1 | 12/2021 | |
| WO | 2022018782 | A | 1/2022 | |

OTHER PUBLICATIONS

International Search Report and Written Opinion for PCT/US2023/015842 dated Jul. 11, 2023, 8 pgs.

Buijsse B: “Miniature SEM with permanent-magnet lenses”, Electron Microscopy and Analysis 2003. Institute of Physics Electron Microscopy and Analysis Group Conference (Inst. of Phys. Conference Series vol. 179), vol. 179, Jan. 1, 2004 (Jan. 1, 2004), pp. 177-180, XP093314594, Bristol, UK, ISBN: 978-0-7503-0967-7.

Khursheed A. et al: “A portable scanning electron microscope column design based on the use of permanent magnets”, Scanning, vol. 20, No. 2, Mar. 1, 1998 (Mar. 1, 1998), pp. 87-91, XP093316072, US ISSN: 0161-0457, DOI: 10.1002/sca.1998.4950200204.

Partial Supplementary Search Report for European Application No. 23785165.4 dated Oct. 2, 2025, 13 pgs.

A. Khursheed, et al., “A Portable Scanning Electron Microscope Column Design Based on the Use of Permanent Magnets”, Scanning vol. 20, No. 2, Mar. 1998, pp. 87-91, 5 pgs.

B. Buijsse, “Miniature SEM With Permanent-Magnet Lenses”, Electron Microscopy and Analysis 2003. Institute of Physics Electron Microscopy and Analysis Group Conference (Inst. of Phys. Conference Series vol. 1979), Jan. 2004, pp. 177-180, 4 pgs.

Office Action for Korean Application No. 10-2024-7019301 dated Apr. 20, 2026, 7 pgs.

Office Action for Taiwan App. No. 112108421 dated Jun. 5, 2026, 5 pgs.

Supplementary European Search Report (SESR) for EP Application No. 23785165.4 dated Jun. 10, 2026, 12 pgs.

Office Action for Japanese Patent App. No. 2024-530560, issued Aug. 25, 2026, 5 pgs.

* cited by examiner

>10 um Field of View

<7nm Spot Size @ 1keV

~7nm Spot Size @ 400eV

MINIATURE HYBRID ELECTRON BEAM COLUMN

TECHNICAL FIELD

The disclosure generally relates to the field of wafer inspection systems. More particularly the present disclosure relates to miniature electron beam column detectors.

BACKGROUND

Generally, the industry of semiconductor manufacturing involves highly complex techniques for fabricating integrated circuits using semiconductor materials which are layered and patterned onto a substrate, such as silicon. Due to the large scale of circuit integration and the decreasing size of semiconductor devices, the fabricated devices have become increasingly sensitive to defects. That is, defects which cause faults in the device are becoming increasingly smaller. The device needs to be generally fault free prior to shipment to the end users or customers.

Thus, being able to detect smaller and smaller defects has become increasingly important. Types of defects, counts of defects, and signatures found by inspection systems (or inspectors) provide valuable information for semiconductor fabrication to ensure that the manufacturing process established in the research and development phase can ramp, that the process window confirmed in the ramp phase can be transferrable to high volume manufacturing (HVM), and that day-to-day operations in HVM are stable and under-control.

One method for detecting defects is by using a scanning electron microscope (SEM). A SEM can include a plurality of electron beam columns with built-in detectors. As semiconductor devices shrink in size, the detectable defect size decreases and is extremely challenging to detect with traditional optical methods due to the limiting factor of the wavelength of light. One method for detecting these defects is to use electron beams where the wavelength of electron beams can be much smaller than the wavelength of light. However, it is slow in terms of throughput—single column electron beam inspection of a wafer can take days or weeks. To solve this problem, miniaturized multi-column or multi-beam SEMs can enable massively parallel inspection of wafers.

Previous columns have been constructed with all-silicon elements or using metal parts and permanent magnets. The latter technique (silicon "lens-stacks") produces high resolution columns but with limited operating conditions. In certain applications, e.g. desktop SEMs, these limitations are acceptable, but for high-performance applications, such as lithography, metrology or inspection, the limitations are not acceptable. The latter, conventional machining in combination with (possibly arrays of) permanent magnets, provide a path to high throughput applications, but suffer from the lack of alignment accuracy and thus performance and assembly yield. Thus, there is a need for a system that circumvents the specific shortcomings of silicon all-electrostatic columns and the difficulties of conventional small columns by using precise alignment techniques that are only possibly using silicon lens-stacks to combine the silicon columns with permanent magnetic lenses.

SUMMARY

The following presents a simplified summary of the disclosure in order to provide a basic understanding of certain embodiments of the disclosure. This summary is not an extensive overview of the disclosure and it does not identify key/critical elements of the disclosure or delineate the scope of the disclosure. Its sole purpose is to present some concepts disclosed herein in a simplified form as a prelude to the more detailed description that is presented later.

Aspects of the present disclosure relate to a device, system, and miniature electron beam column. The device comprises an electron source, a detector in line with the electron source, and a magnetostatic objective lens in line with the electron source and the detector. The magnetostatic lens includes an aperture. The magnetostatic objective lens is configured to focus an electron beam from the electron source as it passes through the aperture.

In some embodiments, the device comprises silicon MEMS technology. In some embodiments, the magnetostatic objective lens is lithographically placed to align with the other elements of the device. In some embodiments, the magnetostatic objective lens is placed using lithographically placed fiducials configured to align with other lithographically placed fiducials on other elements of the device. In some embodiments, stray fields caused by the magnetostatic objective lens are negated using a high mu metal strategically placed around the device. In some embodiments, the magnetostatic lens is rounded. In some embodiments, the device is a miniature electron beam column.

These and other aspects of the disclosure are described further below with reference to the figures.

DETAILED DESCRIPTION OF EXAMPLE EMBODIMENTS

Figure 1B:
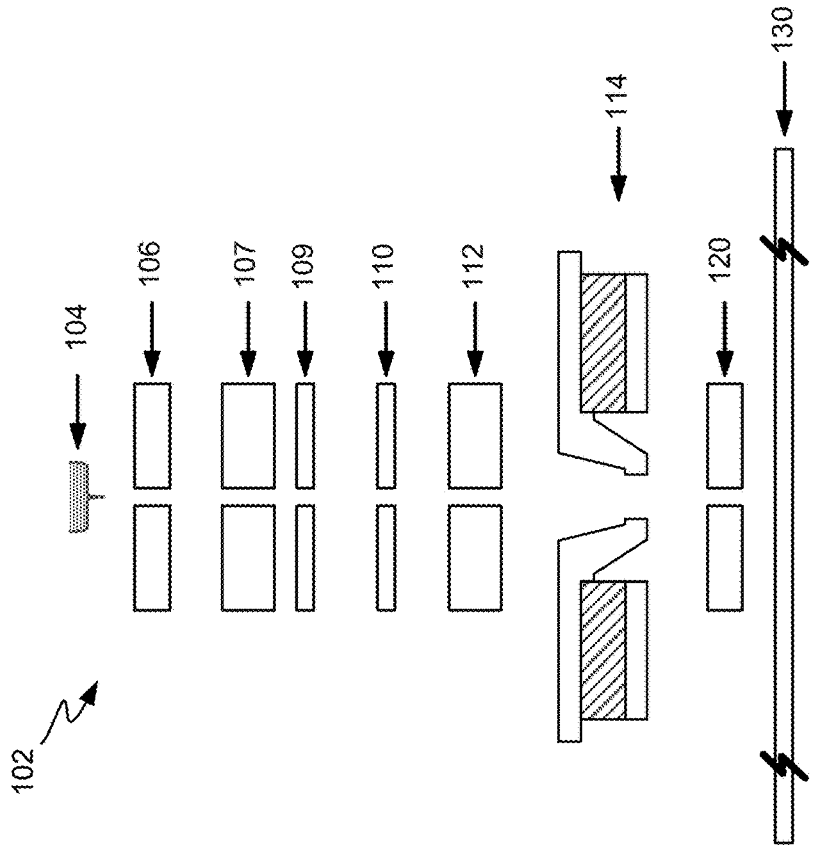
FIG. 1B illustrates another example miniature column configuration, in accordance with embodiments of the present disclosure.

In the following description, numerous specific details are set forth in order to provide a thorough understanding of the present disclosure. The present disclosure may be practiced without some or all of these specific details. In other instances, well known process operations have not been described in detail to not unnecessarily obscure the present disclosure. While the disclosure will be described in conjunction with the specific embodiments, it will be understood that it is not intended to limit the disclosure to the embodiments.

As mentioned above, there is a need to have high throughput electron beam systems. Generally, this is accomplished by miniaturizing the column itself so that multiple columns can be used in parallel. Miniaturizing columns can be accomplished using electrostatics, magnetics, or magnetostatics. Electrostatics work well but they have limitations. The largest limitation for electrostatics is that the quality of the resolution is limited due to various constraints. Thus, one alternative is to use magnetics. However, magnetics, which includes the use of coils and electromagnetics, require the system and devices to be large. As previously mentioned, miniature columns are needed to increase throughput. Thus, a third option is to use magnetostatics. Using magnetostatics allows the use of fixed magnets that basically shape magnetic fields to get high resolution. Thus, a solution to the problems presented is to build a miniature column using silicon MEMS technology, or any "miniature" technology, in combination with a small compact magnetostatic element to get a very high resolution system.

According to various embodiments, techniques and mechanisms of the present disclosure describe the use of miniature silicon-based electron optic elements in combination with magnetostatic (permanent magnet) lenses to produce very high-performance miniature electron or ion beam columns. This combination provides high-accuracy formation and alignment of critical optical elements and the magnetic lenses provide low-aberration focusing or condensing elements. According to various embodiments, accurate assembly of the silicon and magnetic components is achievable via the multilayered assembly techniques) and is critical to achieving the highest performance (e.g., spot-size, beam current and field-of-view—FOV).

One of the biggest hurdles in incorporating magnetostatics into silicon MEMS technology has been alignment in the fabrication. Another very large hurdle is the creation of stray fields. Conventionally, electrostatic columns have been made using conventional machining technology. However, conventional machining technology cannot produce the accuracy needed for miniature electron columns. Conventional machining technology can only fabricate on the order of microns at best. However, miniature electron beam columns require accuracy on the order of nanometers.

According to various embodiments, alignment accuracy is key to the assembly process. During fabrication, the placement of patterns is all done lithographically. For example, the apertures are placed lithographically with a great deal of accuracy both in geometry and location. In some embodiments, the components have fiducials that are also lithographically placed, which allow precision in lens-to-lens placement. This is because aligning fiducial to fiducial is much more accurate than trying to capture oddly sized shapes or circles.

Thus, the techniques and mechanisms of the present disclosure provide for a design of a miniature silicon column with electron optics performance compatible with a permanent magnet. According to various embodiments, this entails a) designing bore diameters, spacings and silicon thicknesses that are compatible with standard micromachining (MEMS—micro-electro-mechanical systems) techniques and IC technologies, and are not in violation of commonly accepted high-field practices, b) incorporating sufficient fiducials throughout the components (including the magnet) to ensure accurate alignment between elements, c) designing magnet size, performance and structure to ensure highest performance (including possibly bias magnet for E×B fields) and d) understanding the tolerance requirements for each individual element. In some embodiments, an assembly technique whereby each component is accurately aligned within the column within specifications detailed above is utilized. In some embodiments, the tools required for column assembly require accurate calibration.

According to various embodiments, magnetostatic lenses tend to leak fields. Thus, it is difficult to control exactly what environment the electrons see when traveling down the column, which leads to distortion. One solution to this is to use shielding. In some embodiments, additional components that essentially shield the beam itself from the leaky fields of the magnet are placed strategically to increase the resolution.

Thus, the techniques and mechanisms described herein provide example approaches, as well as example system implementations, the details of where are described below with reference to the following figures.

Figure 1A:
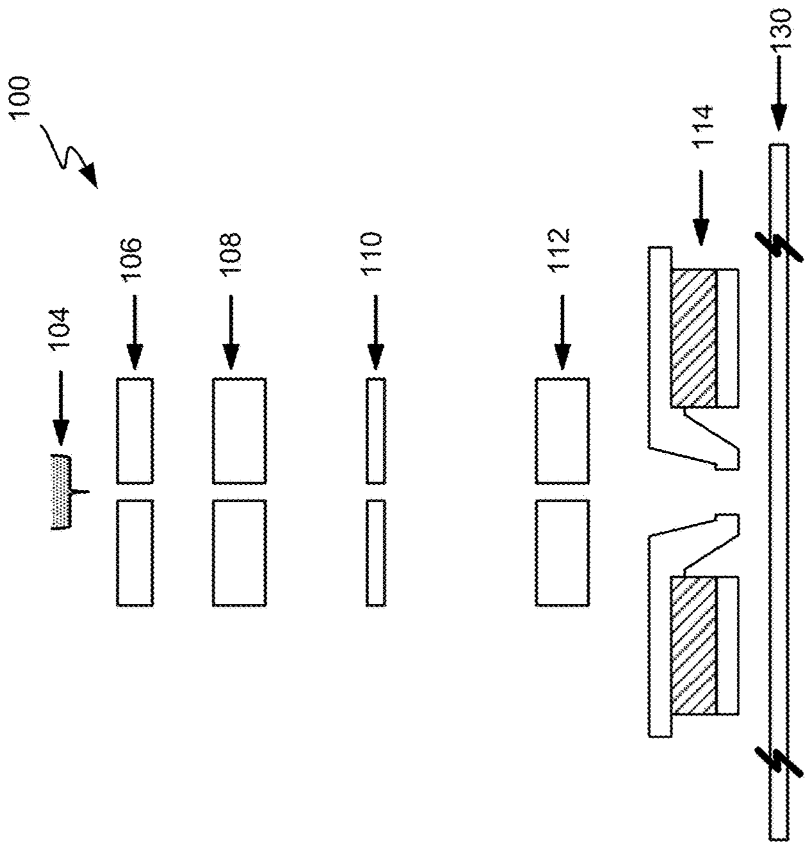
FIG. 1A illustrates an example miniature column configuration, in accordance with embodiments of the present disclosure.

FIGS. 1A and 1B illustrate an example electron beam column, in accordance with embodiments of the present disclosure. FIG. 1A illustrates an example miniature electron beam column 100, in accordance with embodiments of the present disclosure. FIG. 1B illustrates an alternative miniature electron beam column 102, in accordance with embodiments of the present disclosure.

In some embodiments, an electron beam is emitted from electron source 104. In some embodiments, source 104 is an electron thermal emitter. In some embodiments, extractor/condenser 106 extracts electrons from source 104. In some embodiments, the extractor portion (the first half of extractor/condenser 106) is an anode that has a high voltage applied to it, thereby creating an electric field, in order to extract electrons from source 104. In some embodiments, beneath the extractor portion is the condenser portion of extractor/condenser 106. In some embodiments, the condenser portion is what makes the electrons parallel down the column. Beneath extractor/condenser 106 is steering deflector/limiting aperture 108. The deflector portion effectively steers the electron beam into the limiting aperture portion. In some embodiments, limiting aperture portion defines the accepted angle at the source. In some embodiments, the limiting aperture portion defines the numerical aperture (NA), which then determines the resolution and the beam current of the system. In some embodiments, the limiting aperture portion filters the beam down to the order of tens of microns.

In some embodiments, the electron beam then passes through the through-hole of detector 110. In some embodiments, detector 110 is face down toward the sample 130. In some embodiments, detector 110 is a silicon diode, such as a PIN diode. In some embodiments, the electron beam then passes through dual scanning deflectors 112. In some embodiments, dual scanning deflectors 112 are scan coils raster scan the electron beam over sample 130. In some embodiments, magnetic objective lens 114 then focuses the electron beam onto sample 130. In some embodiments, magnetostatic lens 114 includes a high mu metal configured to direct magnetic fields to form a focusing field that further focuses the electron beam. In some embodiments, magnetostatic lens 114 is designed to better align e-beam column 100 and to increase performance.

It should be noted, that because of the state of the current art, it is very difficult to insert a magnetostatic lens into an electron beam column. Normally, a magnetostatic lens would wreak havoc on the function of the electron beam column due to the fields emanating from the magnet, which interact with the electron fields in the upper part of the column. By way of example, measured or modeled lateral fields on the backside of the magnetostatic lens can approach 3-5 Gauss, depending on the distance from the optical axis. For reference, the earth's magnetic field is ~0.5 Gauss. Under these conditions, using the well-known equation of motion for an electron in a constant magnetic field, $r=mv/qB$ (where r=radius of curvature, m=mass electron, v=electron velocity, q=charge on the electron and B=magnetic field), the expected deflection of a 1 keV electron is 7 um per mm of travel through the column. If apertures in the column are roughly 10 um in diameter, the electrons will be blocked if they travel more that 2 mm. In addition, this additional field problem can normally be addressed using an electromagnetic lens. However, electromagnetic lenses require too much power and are too large for miniature electron beam columns.

In some embodiments, these challenges can be addressed by first arranging multiple columns into an array and then subsequently adding shields. In some embodiments, the shield is also made of a mu metal. In some embodiments, each electron beam column is fitted with two mu metal field termination shields near the electron source. In some embodiments, additional shields are placed in the electron column system to short circuit the additional magnetic field and have return paths for the magnetic fields such that those magnetic fields do not interfere with the electron beam of the column which comes through the middle of the column. In such embodiments, without additional shields, the magnetic fields generated by the magnetostatic lens are going to leak up into the electron beam path and if the beam tries to come through the column, it either gets distorted or it gets deflected and will not go through the column correctly. In some embodiments, the column is built with layers of mu-metal placed horizontally (or perpendicular to the beam). In some other embodiments, there may be multiple layers of shielding e.g. shield-in-shield to improve the attenuation of stray fields In some embodiments, a column comprises lens stacks (lenses), a permanent magnet (magnet), and multilayer boards (boards). In some embodiments, the lens stack are micro-machined multi-layer structures consisting of silicon apertures and glass isolators. In some embodiments, the multilayer boards consist of ceramic multilayers, a metal support structure, and connectors. In some embodiments, each lens and magnet include lithographically placed fiducials designed to mate with vertically adjacent lenses. In some embodiments, assembly of the lenses and magnet onto the boards is done using a high placement accuracy pick and place assembly tool.

According to various embodiments, the performance of the columns depends, in part, on placing the center of each lens and magnet precisely on the optical axis. In some embodiments, using a coordinate system where the x and y axes form a Cartesian plane, the optical axis is perpendicular to the x-y plane. In some embodiments, the location of optical axis is defined by location of the center of the first lens.

According to various embodiments, the column is designed such that each lens is aligned to the lens directly below it. In such embodiments, the placement of the center of each lens relative to the optical axis is determined by the placement of the lithographically placed fiducials and the accuracy of the pick and place tool. In many cases, lens-to-lens alignment is the most precise method of minimizing total stack up misalignment of the lens assembly.

In some embodiments, each lens must be aligned linearly and rotationally to printed contact pads on the board. In such embodiments, because lenses are aligned to lenses, not to the board, and the optical axis is determined by the placement of the first lens, the board-to board alignment must be controlled. In some embodiments, this is done using a pin and slot alignment.

One example of an alignment process is as follows: (1) Align and place lens 1 to board 1. The center of lens 1 defines the optical axis. (2) Attach board 2 to board 1. (3) Using fiducials on lens 2 and lens 1, align lens 2 to lens 1 and place. (4) Attach board 3 to board 2. (5) Continue this process until all lenses and boards are assembled. According to various embodiments, there are many bonding techniques suitable for securing lenses to boards including adhesive, eutectic, or solder processes.

In some embodiments, a single electron column utilizes an array of lenses. In other embodiments, a single electron column utilizes a single magnetostatic lens. With only a single lens, the bore diameter of the lens can be much larger. With a larger magnetic lens bore, this allows for backscattered electrons to be collected at the detector.

In some embodiments, objective lens 114 is actually round in shape. In such embodiments, the round shape, as opposed to the traditional square shape, allows the lens to be turned on a lathe, thereby improving the precision and accuracy of the fabrication of the lens. Higher precision means the fields themselves end up being more precise and allow a higher resolution, while introducing fewer aberrations. The better geometry of the magnet allows placement with more precision.

In some embodiments, after the electron beam is raster scanned over sample 130, the electrons are reflected back as secondary/backscattered electrons toward detector 110 in a diffuse manner. In some embodiments, dual deflector 112 is responsible for steering the beam off to the side.

As shown in FIG. 1B, in some embodiments, miniature electron beam column 102 includes a post-lens element 120 in order to control the SE and BSE signal on detector 110. In some embodiments, post-lens element 120 is a post-lens deflector/dynamic focus element. In some embodiments, having the deflector be post lens reduces introduction of additional aberrations or distortions from the lens itself. In addition, in some embodiments, post-lens element 120 can also perform dynamic focus to always ensure that the beam is in focus. Also shown in FIG. 1B, in some embodiments, electron beam column 102 replaces steering deflector/limiting aperture 108 into a separate dual steering deflector 107 and a separate limiting aperture 109. In such embodiments, a separate dual steering deflector 107 gives the column improved ability to steer the beam back on its axis, thereby improving resolution.

Figure 1D:
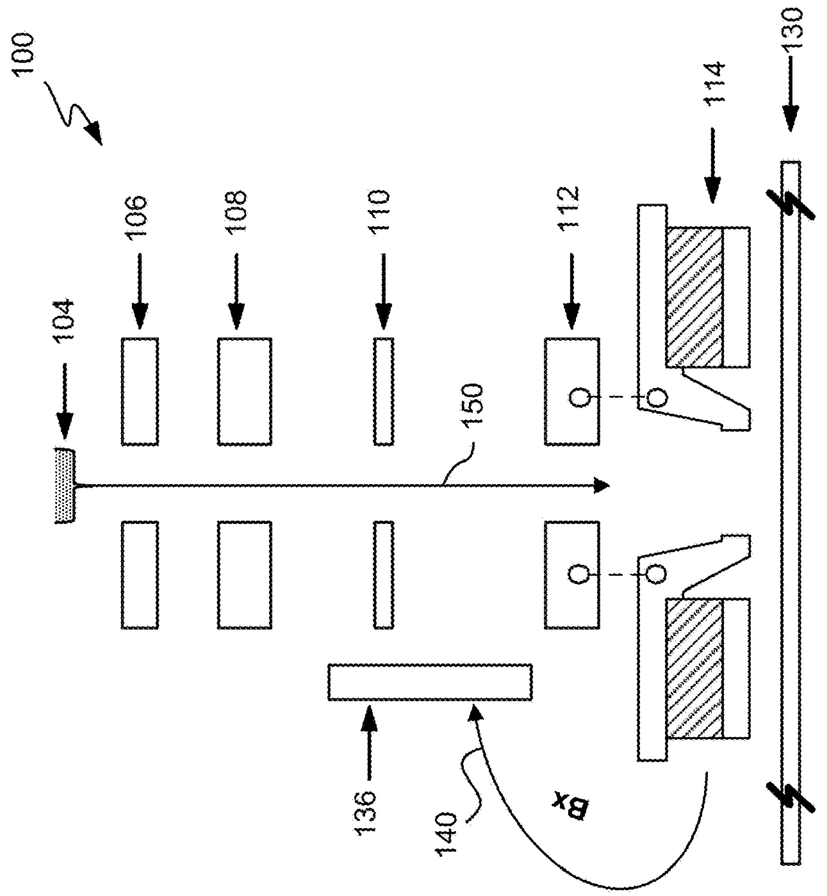
FIG. 1D illustrates an example of how to counteract the effect of magnetic lenses on an electron beam column, in accordance with embodiments of the present disclosure.
Figure 1C:
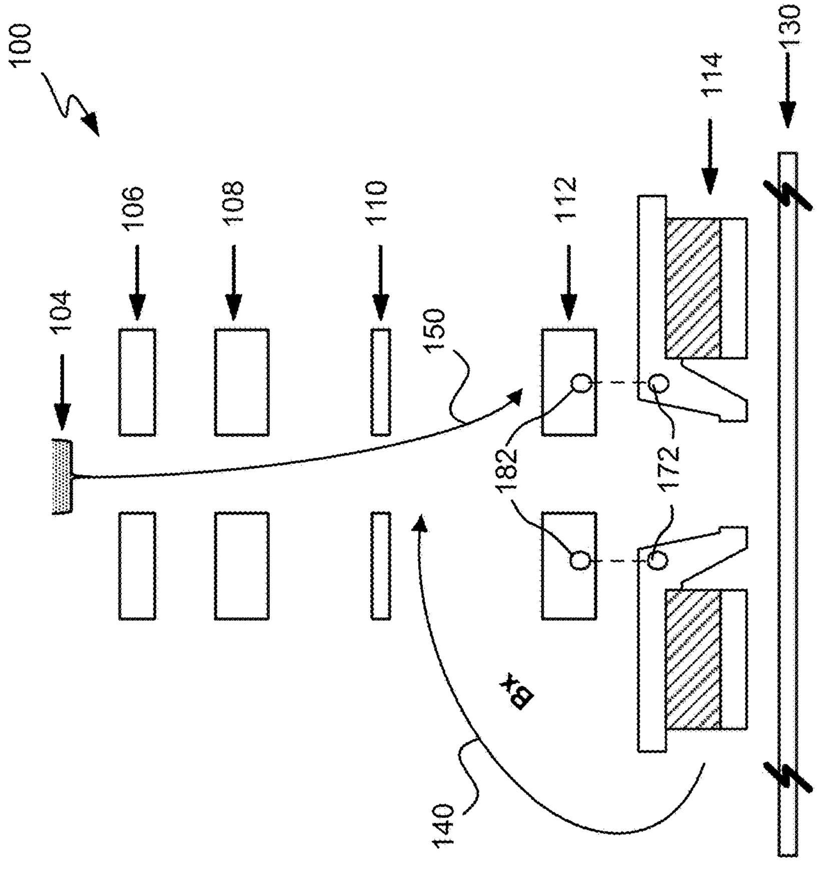
FIG. 1C illustrates an example of how magnetic lenses affects an electron beam column, in accordance with embodiments of the present disclosure.

FIG. 1C shows how a magnetic field 140 from magneto static lens 114 can affect the trajectory of electron beam 150. Magnetostatic lenses tend to "leak" stray lateral (Bx and By) fields which deflect electron beam 150 off-axis. This can be especially true in miniature columns because of the low-voltage operation of miniature columns, which make miniature columns more sensitive to the lateral magnetic fields. In addition, the design of magnetostatic lenses can greatly influence the magnitude of this effect. It should be noted that "conventional" electromagnetic lenses are self-shielding and avoid these complications. As shown in FIG. 1C, electron beam 150 is bent by magnetic field 140, causing electron beam 150 to veer off its axis. For convenience purposes, only one magnetic field (Bx) is shown. However, it should be noted that a By field (not shown) can also bend electron beam 150 off axis.

FIG. 1D depicts an example embodiment where a shield 136 is inserted into the correct place in the system during assembly. Shield 136 blocks or negates magnetic field 140, thereby allowing electron beam 150 to travel straight along its axis, undistorted. According to various embodiments, the size and placement of shields (which can be extremely high permeability compounds) depend on the specific design of the column and objective lens.

In some embodiments, the center line of electron beam 150 has to be very accurately aligned with the center of the magnetostatic lens 114. In such embodiments, achieving accurate alignment between a MEMS column and mechanically assembled magnet may be very difficult. Thus, in some embodiments, alignment marks 172 are patterned onto lens 114, which then match up with alignment marks 182 somewhere on electron beam column 100. In some embodiments, alignment marks 182 and 172 are fiducials that are lithographically placed onto the lens and column, and are configured to mate together (thereby forming concentric circles on top of each other). Once two pairs of alignment marks mate at two different locations, then magnetostatic lens 114 is aligned with the rest of electron beam column 100. In some embodiments, because electron beam column 100 is a miniature electron beam column, the accuracy needed is on the scale of nanometers, as opposed to micrometers for conventional electron beam columns. Because of the high accuracy requirement, using silicon MEMS technology, and more specifically, lithography, is the only method for aligning the fiducials. Conventional machining processes cannot achieve accuracy on the scale of nanometers.

Figure 2B:
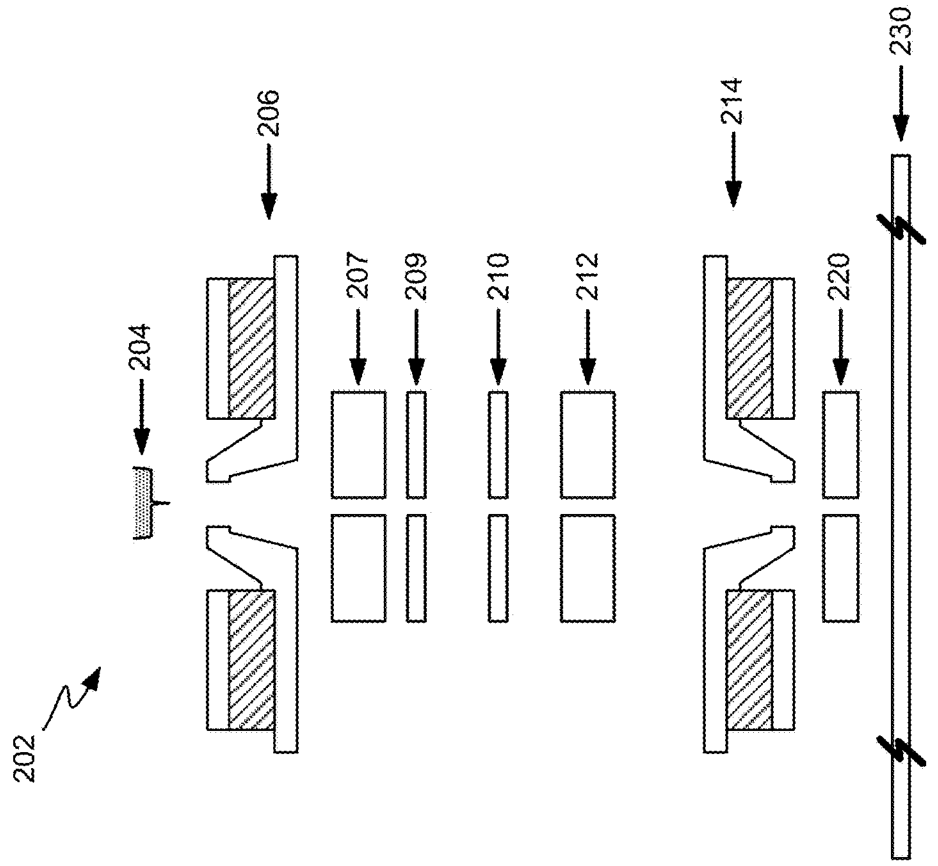
FIG. 2B illustrates another alternative example miniature column configuration, in accordance with embodiments of the present disclosure.
Figure 2A:
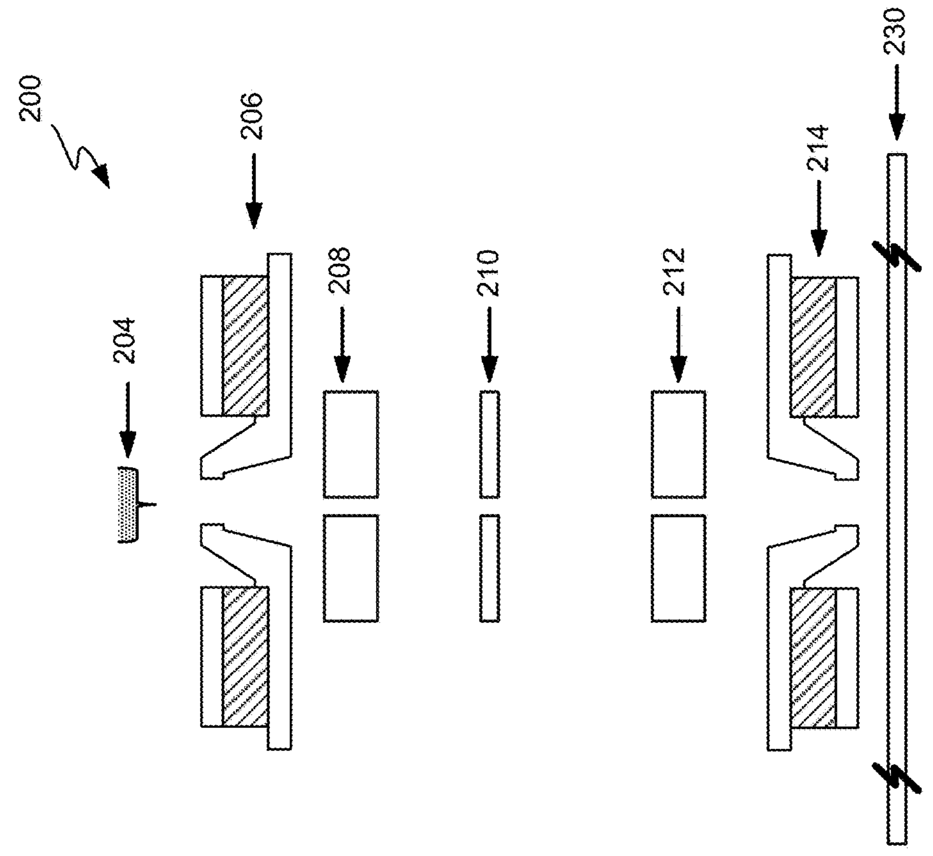
FIG. 2A illustrates an alternative example miniature column configuration, in accordance with embodiments of the present disclosure.

FIG. 2A illustrates an alternative example miniature column configuration, in accordance with embodiments of the present disclosure. FIG. 2B illustrates another alternative example miniature column configuration, in accordance with embodiments of the present disclosure. Electron beam columns 200 and 202 are analogous to columns 100 and 102, except that extractor condenser 204 is implemented using another magnetostatic lens. In some embodiments, lens 204 is just an inverted (flipped upside down) version of lens 214. The remaining elements of 206, 207, 208, 209, 210, 212, 214, 220, and 230 are similar to the analogous features in FIGS. 1A and 1B. In some embodiments, using another magnetostatic lens 204 helps eliminate the stray fields from magnetostatic lens 214. However, columns 200 and 202 are harder to assemble than columns 100 and 102.

Figure 3B:
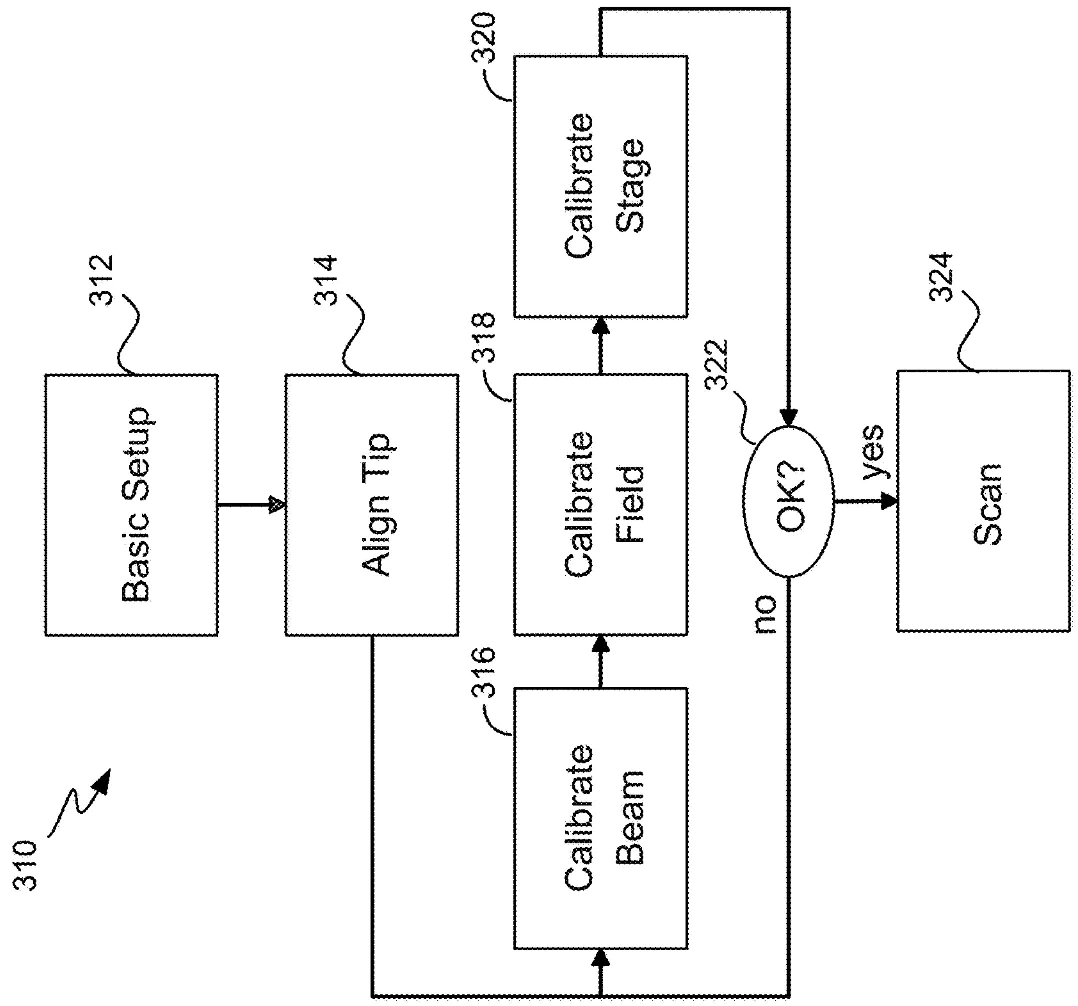
FIG. 3B is a flow chart illustrating an example flow of operation of an electron beam column with system level calibrations, in accordance with embodiments of the present disclosure.
Figure 3A:
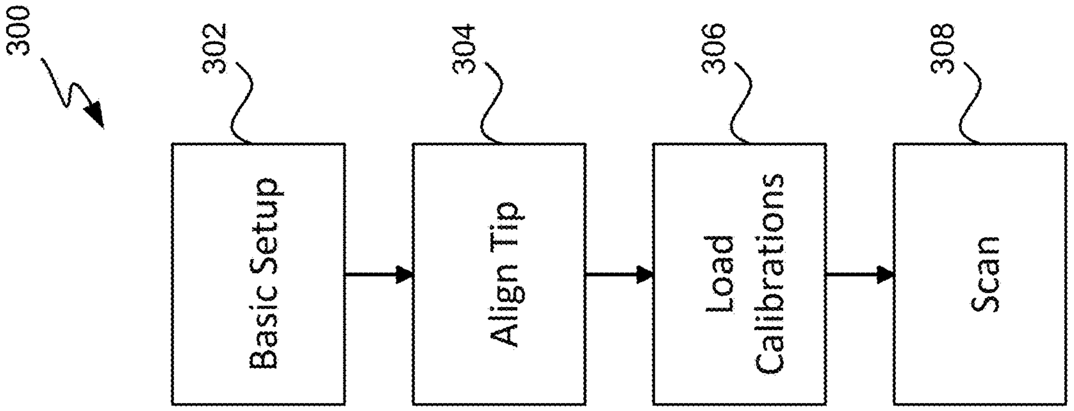
FIG. 3A is a flow chart illustrating an example flow of operation of an electron beam column, in accordance with embodiments of the present disclosure.

FIG. 3A is a flow chart illustrating an example flow of operation 300 of an electron beam column, in accordance with embodiments of the present disclosure. At 302, a basic setup is established. In some embodiments, this is achieved by applying voltages to all electrodes, including the magnetic objective lens. It should be noted that that the lens is not at ground potential and the wafer also is not grounded. At 304, the tip is aligned. In some embodiments, this occurs by using a different fixture from the column itself, e.g., a stage. This is because the column needs to get the tip aligned to the column on the optic axis. In some embodiments, the tip is moved around until it aligns with the extractor. In some embodiments, this can be achieved by measuring current that you get further down the column, which allows the system to know when that tip is exactly at the center of the extractor. In other embodiments, aligning the tip can be achieved by fixing the tip in a locked position relative to the extractor and then utilizing the dual deflector to adjust the alignment with the limiting aperture. At 306, calibrations values are loaded into a database. In some embodiments, calibration values allow the system to know what voltages to apply, how to focus the lens, and how to put the beam in a particular location. For example, the system needs to load calibration values to account for distortion. Last, at 308, the column scans the wafer by sweeping the beam back and forth to get image.

FIG. 3B is a flow chart illustrating an example flow of operation 310 of an electron beam column with system level calibrations, in accordance with embodiments of the present disclosure. In practical usage, the system usually needs to scan in more than one location. In such cases, operation of the electron beam column involves system level calibrations. Flow of operation 310 is similar to flow of operation 300, with basic setup 312 and aligning the tip 314 being analogous to basic setup 302 and aligning the tip 304, respectively. However, instead of just a loading calibrations once, the beam needs to be calibrated at 316, the field needs to be calibrated at 318, and the stage also needs to be calibrated at 320. This is because when the resolution is not clear, it needs to be calibrated. When the beam is deflected, it needs be calibrated. Similarly, when the stage moves, it needs to be calibrated.

In some embodiments, if the stage is moving, the system can calibrate the stage by measuring the velocity of the stage (e.g., by using an interferometer). That data is then fed back to column so the column can calculate how much voltage to add to deflect that beam to follow the stage. In some embodiments, to calibrate the beam, the system looks at a high resolution image, scan over an edge, and that profile will tell the system what the profile of the beam is. In some embodiments, to measure beam current, the system puts the beam in Farraday cup and then measures how much current is going through beam. In some embodiments, system calibration is an iterative process to get it right, and once the system is setup, it can then scan for multiple features of interest.

Figure 4A:
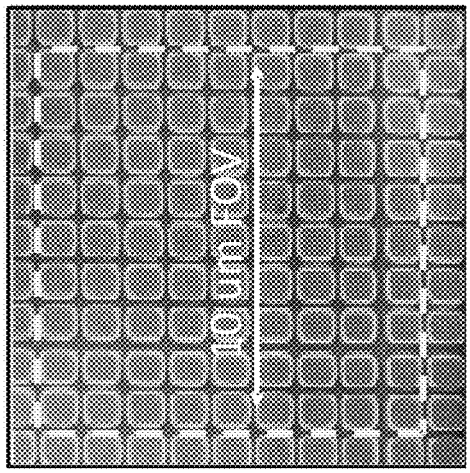
FIGS. 4A-4C illustrate examples of typical results of an electron beam column scan, in accordance with embodiments of the present disclosure.
Figure 4B:
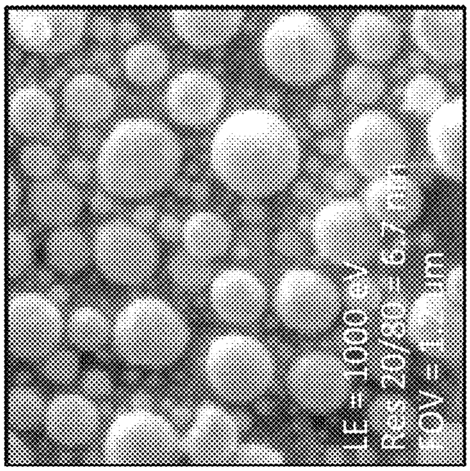
Figure 4C:
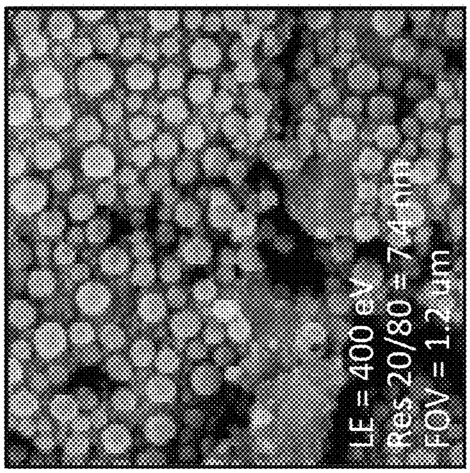

FIGS. 4A-4C illustrate the versatility of the MEMS columns coupled with magnetostatic lenses. FIG. 4A is an example image demonstrating the large, undistorted, aberration-free, field-of-view (FOV) obtainable from a simple magnetostatic lens. The image consists of 1 um silicon squares etched onto a silicon substrate. FIG. 4B demonstrates the high resolution, <7 nm 20%-80% obtained imaging Sn spheres on a Carbon substrate with a landing energy of 1 keV. FOV in this case is 1.2 um. Finally, FIG. 4C demonstrates the ability of the combined electric and magnetic field columns to tune the landing energy to 0.4 keV while maintaining beam resolution (~7.5 nm 20%-80%). Actual tuning range of these columns is typically from 0.5 keV to 3 keV.

Certain embodiments of the present disclosure presented here generally address the field of electron beam columns, and are not limited to the hardware, algorithm/software implementations and architectures, and use cases summarized above.

Although the foregoing disclosure has been described in some detail for purposes of clarity of understanding, it will be apparent that certain changes and modifications may be practiced within the scope of the appended claims. It should be noted that there are many alternative ways of implementing the processes, systems, and apparatus of the present disclosure. Accordingly, the present embodiments are to be considered as illustrative and not restrictive, and the disclosure is not to be limited to the details given herein.

What is claimed is:

1. A device comprising:

a detector in line with an electron source;

a lens stack of silicon micro-electromechanical lenses between the detector and the electron source, wherein the lens stack comprises lithographically placed fiducials configured to align adjacent silicon micro-electromechanical lenses in the lens stack;

a magnetostatic objective lens in line with the detector, the magnetostatic objective lens including an aperture, wherein the magnetostatic objective lens is configured to focus an electron beam from the electron source as it passes through the aperture, wherein the magnetostatic objective lens comprises a permanent magnet lens lithographically placed to align with the silicon micro-electromechanical lenses of the lens stack; and a post-lens element between the magnetostatic objective lens and a sample being imaged during operation, wherein the post-lens element is configured to dynamically focus the electron beam onto the sample to control backscattered electrons and/or secondary electrons from the sample and received at the detector.

2. The device of claim 1, further comprising one or more lithographically placed fiducials on the magnetostatic objective lens, the one or more lithographically placed fiducials configured to align with lithographically placed fiducials on the silicon micro-electromechanical lenses of the lens stack.

3. The device of claim 1, further comprising a high mu metal configured to at least partially negate magnetic fields from the magnetostatic objective lens.

4. The device of claim 1, wherein the magnetostatic objective lens is round in shape.

5. The device of claim 1, further comprising one or more electromagnetic shields between the magnetostatic objective lens and one or more other elements of the device.

6. The device of claim 1, wherein the lens stack comprises a micro-machined multi-layer structure including an aperture and one or more glass isolators.

7. The device of claim 2, wherein the lithographically placed fiducials on the magnetostatic objective lens and the lithographically placed fiducials on the silicon micro-electromechanical lenses of the lens stack are configured to align centers of the silicon micro-electromechanical lenses and center of the magnetostatic objective lens along an axis.

8. A system comprising:

an electron source;

a detector in line with the electron source;

a lens stack of silicon micro-electromechanical lenses between the detector and the electron source, wherein the lens stack comprises lithographically placed fiducials configured to align adjacent silicon micro-electromechanical lenses in the lens stack;

a magnetostatic objective lens in line with the electron source and the detector, the magnetostatic objective lens including an aperture, wherein the magnetostatic objective lens is configured to focus an electron beam from the electron source as it passes through the aperture, wherein the magnetostatic objective lens comprises a permanent magnet lens lithographically placed to align with the silicon micro-electromechanical lenses of the lens stack;

a post-lens element between the magnetostatic objective lens and a sample being imaged during operation, wherein the post-lens element is configured to dynamically focus the electron beam onto the sample to control backscattered electrons and/or secondary electrons from the sample and received at the detector; and a stage upon which the sample being imaged is disposed during operation, the stage configured to translate/rotate relative to the electron source, the detector, the magnetostatic objective lens, and the post-lens element.

9. The system of claim 8, further comprising one or more lithographically placed fiducials on the magnetostatic objective lens, the one or more lithographically placed fiducials configured to align with lithographically placed fiducials on the silicon micro-electromechanical lenses of the lens stack.

10. The system of claim 8, further comprising a high mu metal configured to at least partially negate magnetic fields from the magnetostatic objective lens.

11. The system of claim 8, wherein the lens stack comprises a micro-machined multi-layer structure including an aperture and one or more glass isolators.

12. The system of claim 9, wherein the lithographically placed fiducials on the magnetostatic objective lens and the lithographically placed fiducials on the silicon micro-electromechanical lenses of the lens stack are configured to align centers of the silicon micro-electromechanical lenses and center of the magnetostatic objective lens along an axis.

13. A miniature electron beam column comprising:

an electron source;

a detector in line with the electron source;

a lens stack of silicon micro-electromechanical lenses between the detector and the electron source, wherein the lens stack comprises lithographically placed fiducials configured to align adjacent silicon micro-electromechanical lenses in the lens stack;

a magnetostatic objective lens in line with the electron source and the detector, the magnetostatic objective lens including an aperture, wherein the magnetostatic objective lens is configured to focus an electron beam from the electron source as it passes through the aperture, wherein the magnetostatic objective lens comprises a permanent magnet lens lithographically placed to align with the silicon micro-electromechanical lenses of the lens stack; and a post-lens element between the magnetostatic objective lens and a sample being imaged during operation, wherein the post-lens element is configured to dynamically focus the electron beam onto the sample to control backscattered electrons and/or secondary electrons from the sample and received at the detector.

14. The miniature electron beam column of claim 13, further comprising one or more lithographically placed fiducials on the magnetostatic objective lens, the one or more lithographically placed fiducials configured to align with lithographically placed fiducials on the silicon micro-electromechanical lenses of the lens stack of the miniature electron beam column.

15. The miniature electron beam column of claim 13, further comprising a high mu metal configured to at least partially negate magnetic fields from the magnetostatic objective lens.

16. The miniature electron beam column of claim 13, wherein the magnetostatic objective lens is round in shape.

17. The miniature electron beam column of claim 13, wherein the lens stack comprises a micro-machined multi-layer structure including an aperture and one or more glass isolators.

18. The miniature electron beam column of claim 14, wherein the lithographically placed fiducials on the magnetostatic objective lens and the lithographically placed fiducials on the silicon micro-electromechanical lenses of the lens stack are configured to align centers of the silicon micro-electromechanical lenses and center of the magneto-static objective lens along an axis.

* * * * *